US006009385A

United States Patent [19]
Summerfield

[11] Patent Number: 6,009,385
[45] Date of Patent: Dec. 28, 1999

[54] SPEECH PROCESSING

[75] Inventor: Stephen Summerfield, Coventry, United Kingdom

[73] Assignee: British Telecommunications public limited company, London, United Kingdom

[21] Appl. No.: 08/849,859

[22] PCT Filed: Dec. 15, 1995

[86] PCT No.: PCT/GB95/02943

§ 371 Date: Jul. 9, 1997

§ 102(e) Date: Jul. 9, 1997

[87] PCT Pub. No.: WO89/06877

PCT Pub. Date: Jul. 27, 1989

[30] Foreign Application Priority Data

Dec. 15, 1994 [EP] European Pat. Off. .............. 94309391

[51] Int. Cl.$^6$ ........................................ H03G 7/00

[52] U.S. Cl. ........................ 704/203; 704/211; 704/216

[58] Field of Search ............................ 704/203, 200, 704/204; 395/326–354; 345/132, 133–136, 138–140; 369/137, 728.01, 728.03, 715.01, 724.12

[56] References Cited

U.S. PATENT DOCUMENTS

| | | | |
|---|---|---|---|
| 4,974,187 | 11/1990 | Lawton | 364/728.01 |
| 5,351,338 | 9/1994 | Wigren | 395/2.28 |
| 5,486,833 | 1/1996 | Barrett | 342/204 |
| 5,721,694 | 2/1998 | Graupe | 364/574 |
| 5,781,881 | 7/1998 | Steguann | 704/211 |

FOREIGN PATENT DOCUMENTS

| | | | |
|---|---|---|---|
| WO A 84 02992 | 8/1984 | WIPO | G06F 15/31 |
| WO A 89 06877 | 7/1989 | WIPO | H03G 7/00 |

OTHER PUBLICATIONS

Rioul, O., "Wavelets and Signal Processing", *IEEE Signal Processing Magazine*, pp. 14–38, Oct. 1991, vol. 8, Issue 4.

Chui, *Wavelets: A Tutorial in Theory and Application*, Academic Press, San Diego, CA., pp. 106–112, 1992.

Irino et al, "Signal Reconstruction application to Auditory Signal Processing", ICASSP 92: 1992 IEEE International Conference on Acoustics, Speech and Signal Processing (CAT. No. 92CH3103–9), ISBN 0–7803–0532–9, 1992, New York, NY, US XP002000224.

*Primary Examiner*—Steven Sax
*Attorney, Agent, or Firm*—Nixon & Vanderhye P.C.

[57] ABSTRACT

A clipped input speech waveform is divided into a plurality of a series of signals by means of a wavelet transform such as the Daubechies wavelet transform, which are then scaled or otherwise processed to reduce the effects of clipping, prior to reconstruction of the speech waveform using the inverse transform.

14 Claims, 14 Drawing Sheets

*FIG. 5*
INVERSE
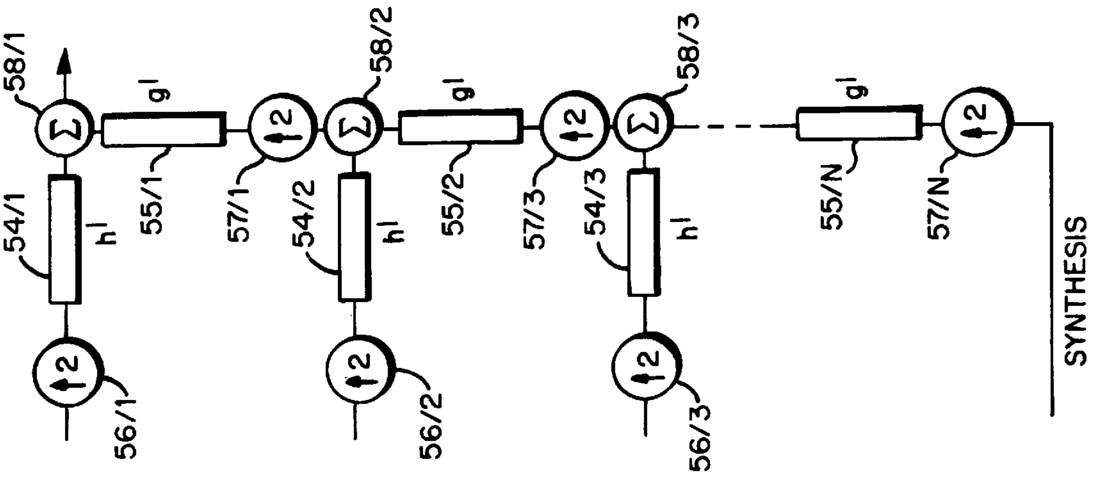
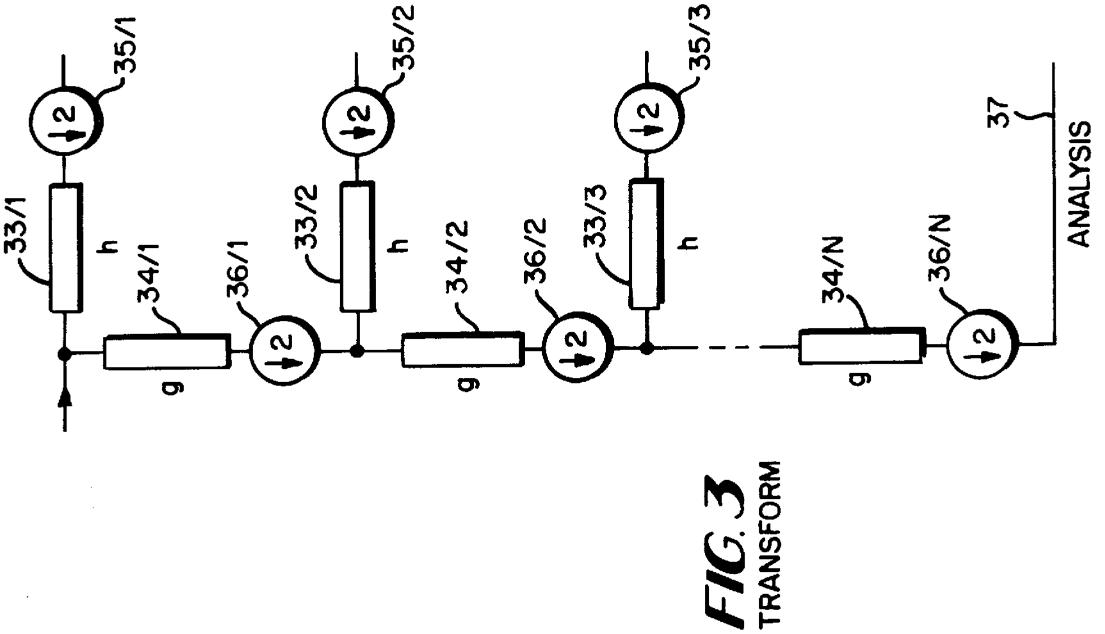
*FIG. 3*
TRANSFORM

WAVELET 1

WAVELET 3

WAVELET 2

WAVELET 4

WAVELET 5

WAVELET 7

WAVELET 6

WAVELET 8

WAVELET 9

WAVELET 11

WAVELET 10

WAVELET 12

SPEECH PROCESSING

BACKGROUND OF THE INVENTION

1. Field of the Invention

The present invention is concerned with processing of speech signals, particularly those which have been distorted by amplitude-limiting processes such as clipping.

2. Related Art

Apart from its obvious effect on perceived speech quality, clipping in a telecommunications system is disadvantageous in that it reduces the dynamic range of the signal which can adversely affect the operation of echo cancellers. According to the present invention there is provided an apparatus for processing speech comprising: means to apply to a speech signal a wavelet transform to generate a plurality of transformed components each of which is the convolution of the signal and a respective one of a set of wavelets $g(t/a_i)$ where $a_i$ is a temporal scaling factor for that component and g(t) is a temporally finite waveform having a mean value of zero; means to modify the components; and means to apply to the modified components the inverse of the said wavelet transform, to produce an output signal; wherein the modifying means is operable to scale at least some of the components differently from one another such as to increase the dynamic range of the output signal.

Other, preferred, aspects of the invention are defined in the claims.

BRIEF DESCRIPTION OF THE DRAWINGS

Some embodiments of the invention will now be described, by way of example, with reference to the accompanying drawings, in which:

FIGS. 2 and 3 are a block diagram of two possible implementations of the wavelet transform unit of FIG. 1;

FIGS. 4 and 5 are block diagrams of two possible implementations of the inverse transform;

DETAILED DESCRIPTION OF EXEMPLARY EMBODIMENTS

Figure 1:
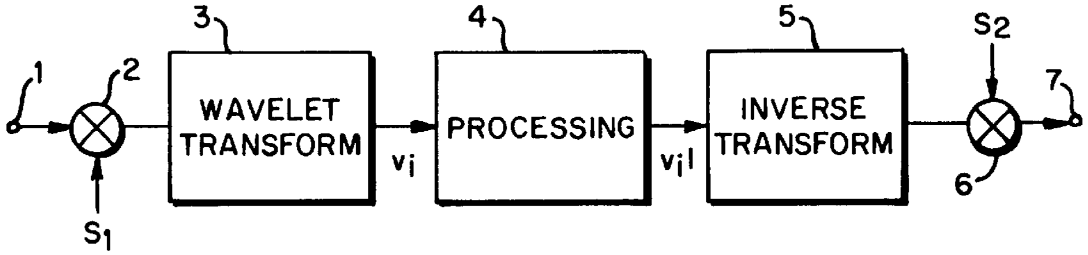
FIG. 1 is a block diagram of one form of speech processing apparatus according to the invention.

The apparatus of FIG. 1 is designed to receive, at an input 1, speech signals which have been distorted by clipping. The input signals are assumed to be in the form of digital samples at some sampling rate $f_s$, e.g. 8 kHz. On the assumption that, because of the clipping, the signal employs the whole of the available dynamic range of the digital representation, it is firstly multiplied, in a multiplier 2, by a scaling factor $S_1$ ($S_1<1$ ) to allow "headroom" for subsequent processing. Of course, an analogue-to-digital converter may be added if an analogue input is required. The signals are then supplied to a filter arrangement 3 which applies to the signals a Wavelet Transform, to produce N (e.g. five) outputs corresponding to respective transform levels. The series of signals $V_i$ (i=1, . . . N) appearing at these outputs are fed to a processing unit 4 which scales or otherwise processes them to produce N processed outputs $V_i'$ which are then subject to the inverse wavelet transform in an inverse transform unit 5, to provide, after further scaling by a multiplier 6, a reconstructed speech signal at an output 7.

The general form of the wavelet transform $W_g$ of a function f(t) is $$W_g = \int f(\tau) g\left(\frac{\tau - b}{a}\right) d\tau$$

where g is the transform kernel.

If b is regarded as the independent variable of $W_g$, and expressed as a time series for discrete values $a_i$ of a, then writing also a summation for the integral as we are dealing with a discrete system) we have a set of series for the transformed signal:

$$W_{a_i} = \sum_{\tau=t-(n-1)}^{t} f(\tau) g\left(\frac{\tau - t}{a_i}\right)$$

where i (i=1, . . . N) is the level of the series and n is the number of filter coefficients.

Figure 2:
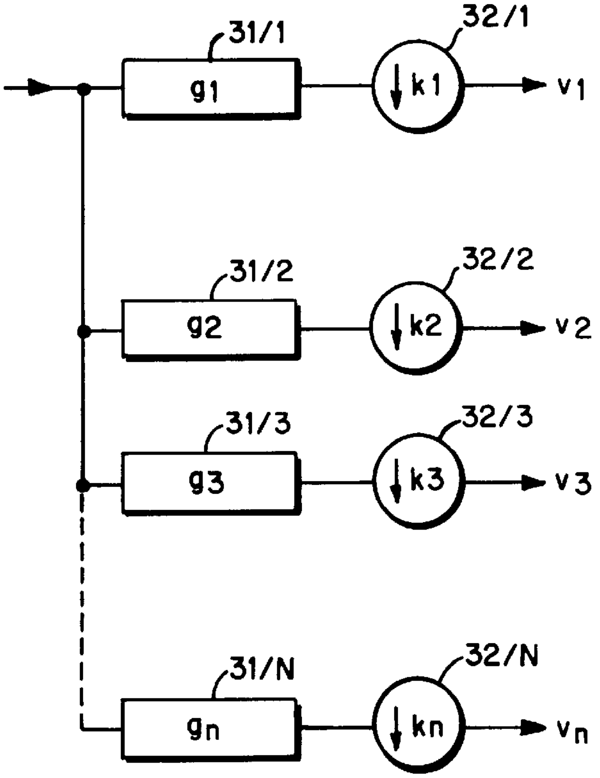

If we write $g(x/a_i)=g_i(x)$ then $$v_i = W_{a_i} = \sum_{\tau=t-(n-1)}^{t} f(\tau) g_i(\tau - t)$$

which can be implemented by a bank of N filters having coefficients given by $g_1$ to $g_N$ respectively. Such a filter bank is shown in FIG. 2 with N filters 31/1 to 31/N.

The transform kernel g can in principle be any wavelet, i.e. a temporally finite waveform having a mean value of zero; however, particularly preferred is the use of a Daubechies wavelet, a formal definition of which may be found in I Daubechies "Orthonormal Bases of Compactly Supported Wavelets", Comm. Pure & Applied Maths, Vol. XLI, No. 7, pp 909–996 (1988).

In this embodiment, $a_i=2^i$.

Because of the limited bandwidth of the filters their outputs contain a lot of redundant information and can be downsampled to a lower sampling rate by decimators 32/1 to 32/N, in each case by a factor $k_i=2^i$.

Alternatively, the filter bank may be constructed from cascaded quadrature mirror filter pairs, as shown in FIG. 3, where a first pair 33/1, 34/1 with coefficients g and h feed decimators 35/1, 36/1 (of factor 2) and so on. Comparison with FIG. 1 shows that $h=g_1$. Note that, unlike the FIG. 2 construction, this structure has a further output, referenced 37 in FIG. 3, carrying a residual signal—i.e. that part of the input information not represented by the N transformed outputs. This may be connected directly to the corresponding input of the synthesis filter.

Figure 4:
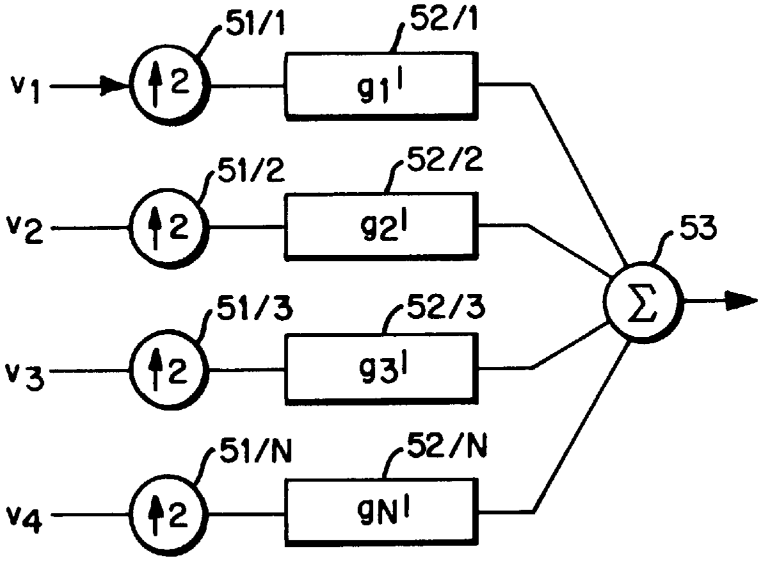

FIG. 4 shows one implementation of the inverse transform unit 5, with upsampling devices 51/1, 51/2 . . . 51/N having the same factors $k_1, \ldots k_N$ as the decimators in FIG. 2, followed by filters 52/1, 52/2, . . . 52/N having coefficient sets g1', g2', . . . gN' whose outputs are combined in an adder 53. Each coefficient set g1' etc.. is a time-reversed version of the coefficient set g1 etc.. used for the corresponding filter in FIG. 2.

FIG. 5 shows a cascaded quadrature mirror filter form of the inverse transform unit 5, with filters 54/1, 54/2, . . . 54/N having coefficients h' and filters 55/1, 55/2, . . . 55/N with coefficients g'. h' and g' are time-reversed versions of the coefficient sets h and g respectively, used in FIG. 3. Upsamplers 56/1, 56/2, . . . 56/N and 57/1, 57/2, . . . 57/N are shown, as are adders 58/1, 58/2, . . . 58/N. Each section is similar: for example the second section receives the second order input, upsamples it by a factor of two in the upsampler 56/2 and passes it to the filter 54/2. The filter output is added in the adder 58/2 with the sum of higher-order contributions fed to the second input of the adder via the x2 upsampler 57/2 and filter 55/2. The highest order section receives the residual signal at its upsampler 57/N. The output of the unit 5 is produced by the adder 58/1.

As an analysis method wavelet transforms are, ideally, characterised by the qualities of completeness of representation, which implies invertability, and orthogonally, which implies minimal representational redundancy. Furthermore, in principle, one could adopt the notion that the mother wavelet (or wavelets) should be designed to closely match the characteristics of speech such that the representation is compact, in the sense that as few coefficients as possible in the transform domain have significance.

The Daubechies wavelet transform has neatly rounded triangle of orthogonality, scale and translation factors and invertability. The cost is that the waves are completely specified and are therefore generic and cannot be adapted for speech or any other signal in particular.

Now it may be that for power of two decimations FIG. 3 is actually a general form and that the Daubachies theory actually amounts to the imposition if orthogonality and invertibility with this.

Figure 6A:
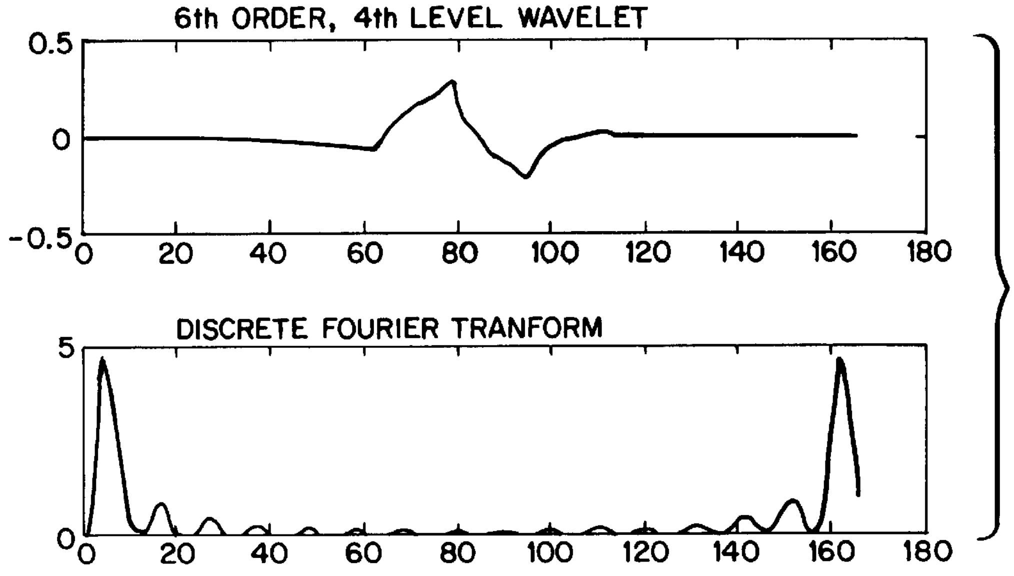
FIGS. 6*a* and 6*b* show graphically two versions of the Daubechies wavelet.
Figure 6B:
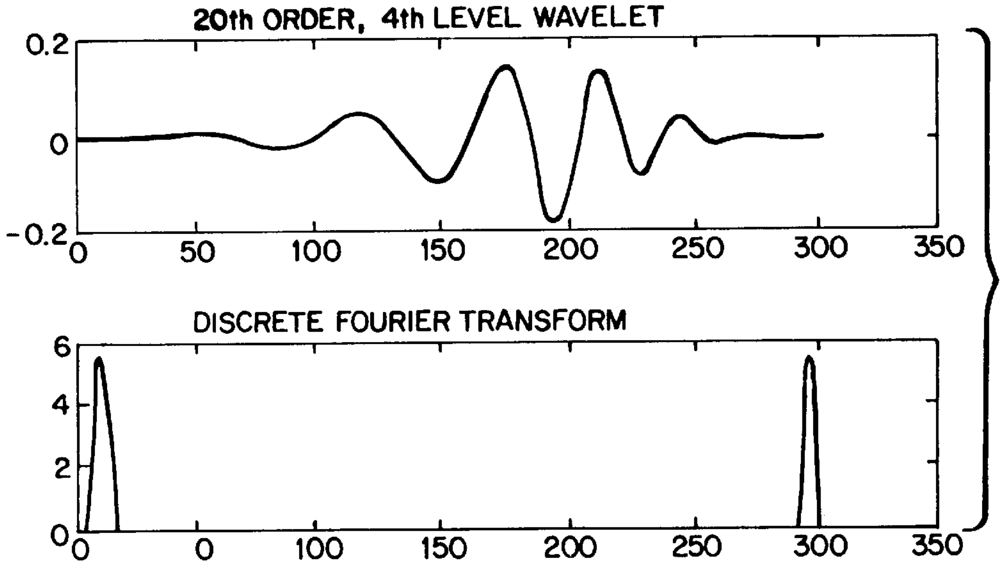
Figure 7A:
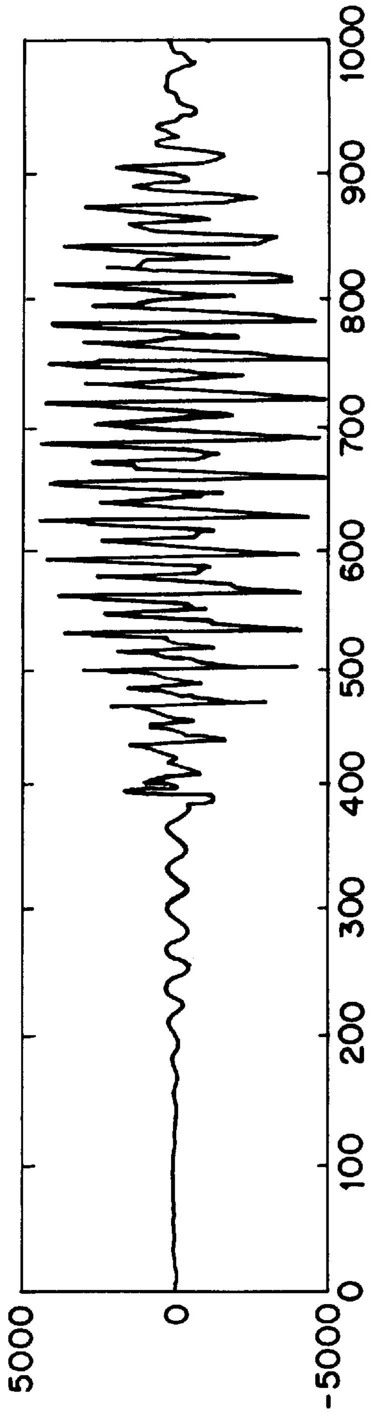
FIGS. 7*a*–7*d* provide a graph of a test speech waveform.
Figure 7B:
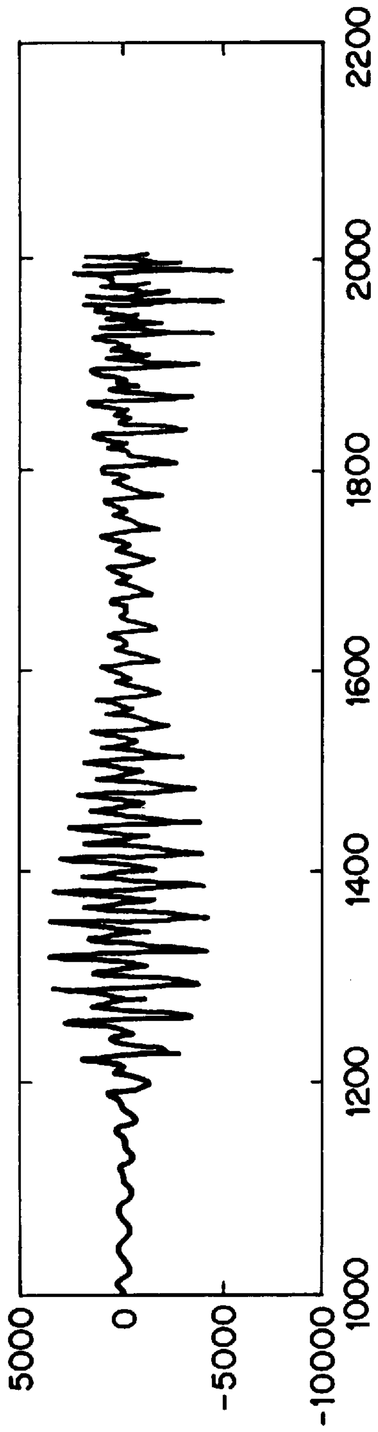
Figure 7C:
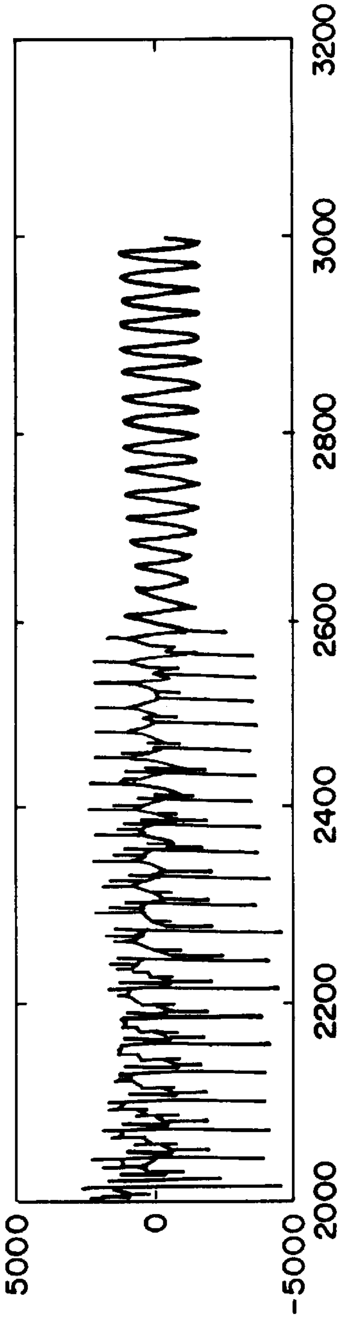
Figure 7D:
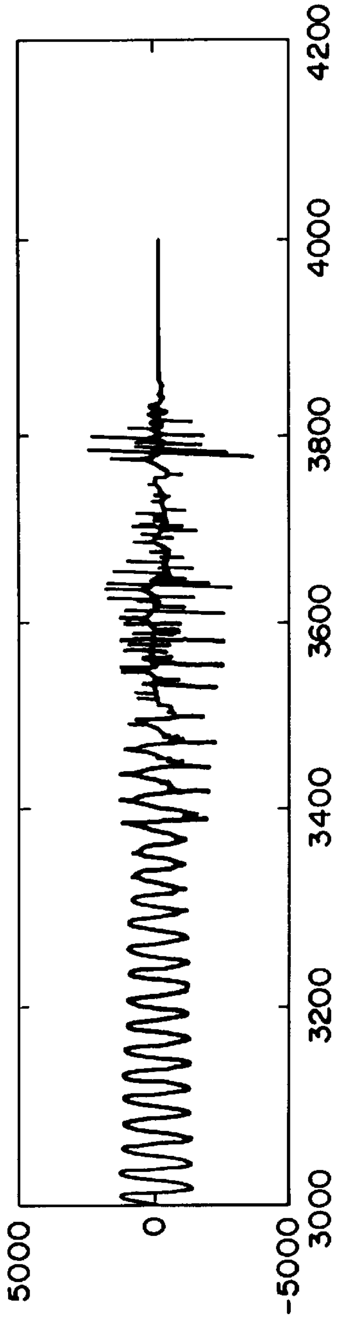
Figure 8A:
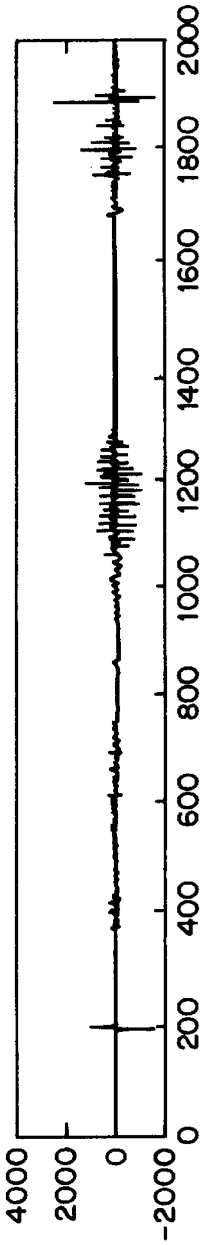
FIGS. 8*a*–8*f* and 9*a*–9*f* are graphs showing respectively the transformed version of the test waveform and the clipped test waveform.
Figure 8B:
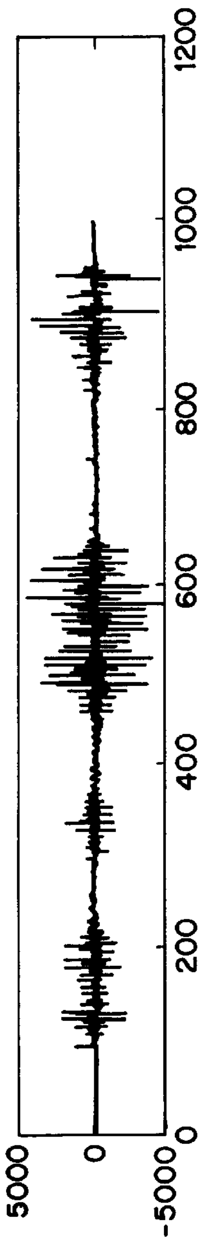
Figure 8C:
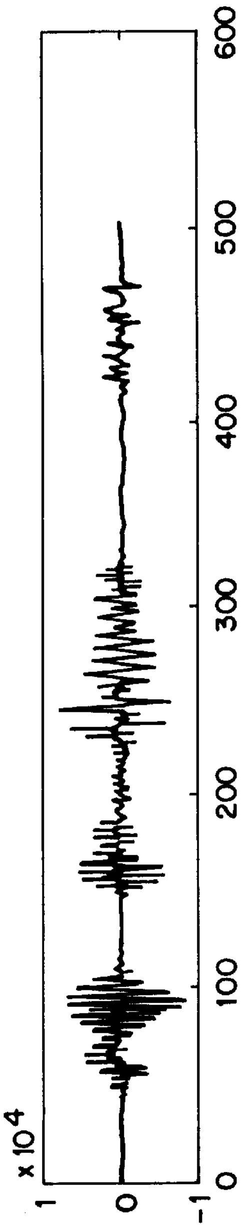
Figure 8D:
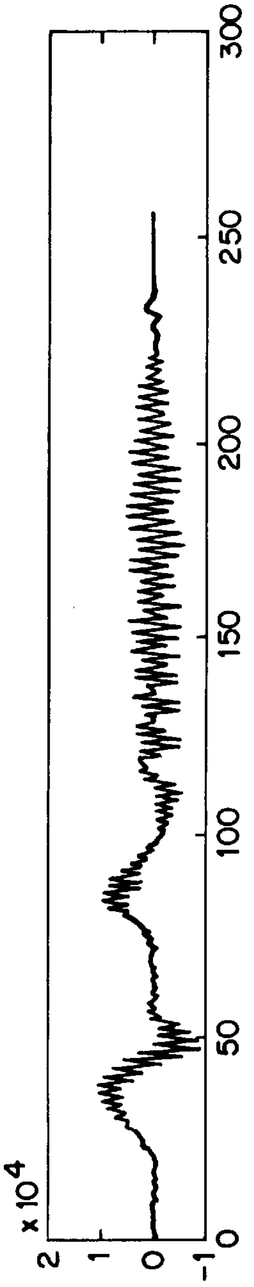
Figure 8E:
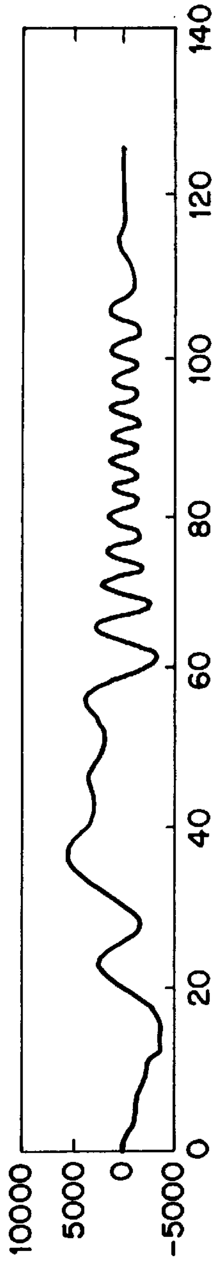
Figure 8F:
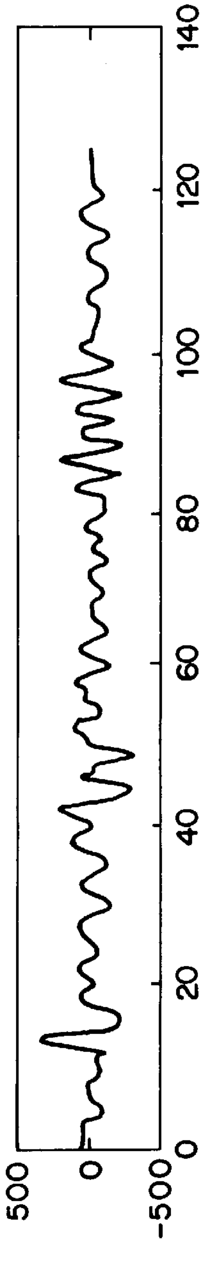
Figure 9A:
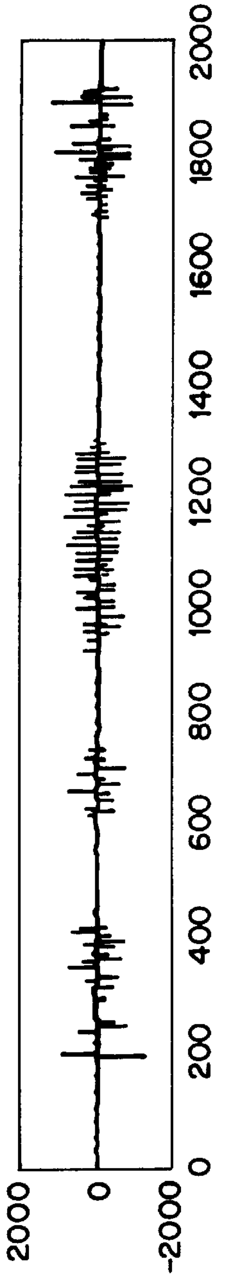
Figure 9B:
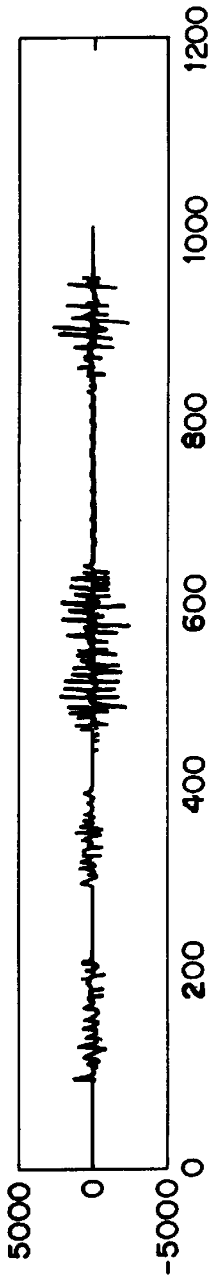
Figure 9C:
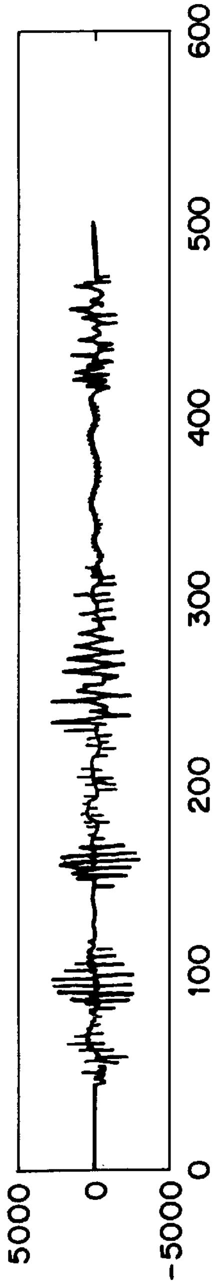
Figure 9D:
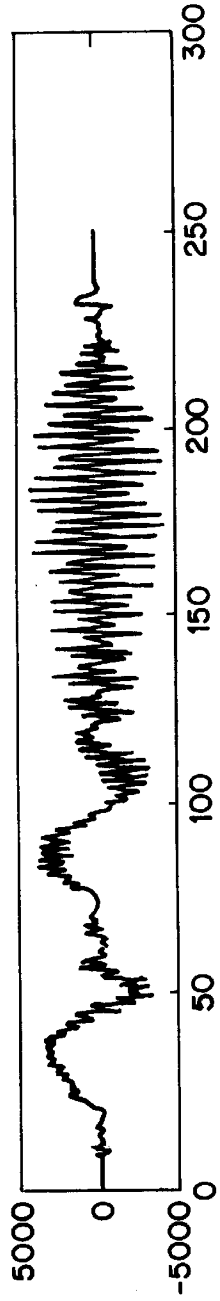
Figure 9E:
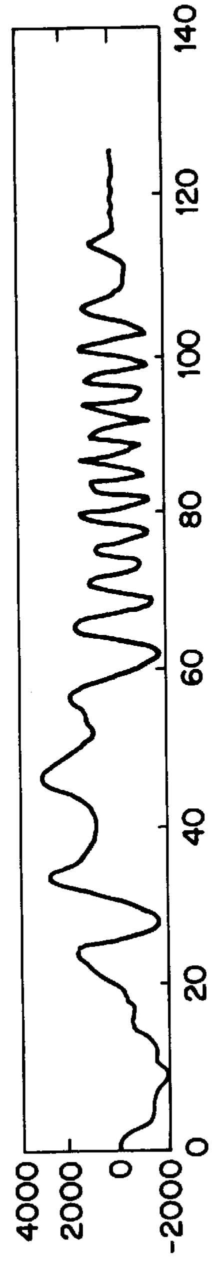
Figure 9F:
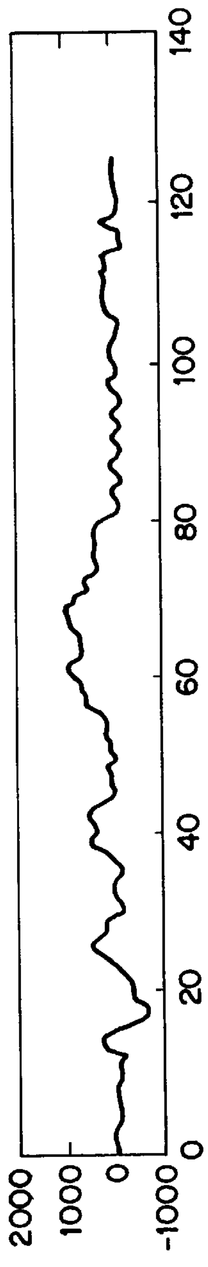
Figure 11A:
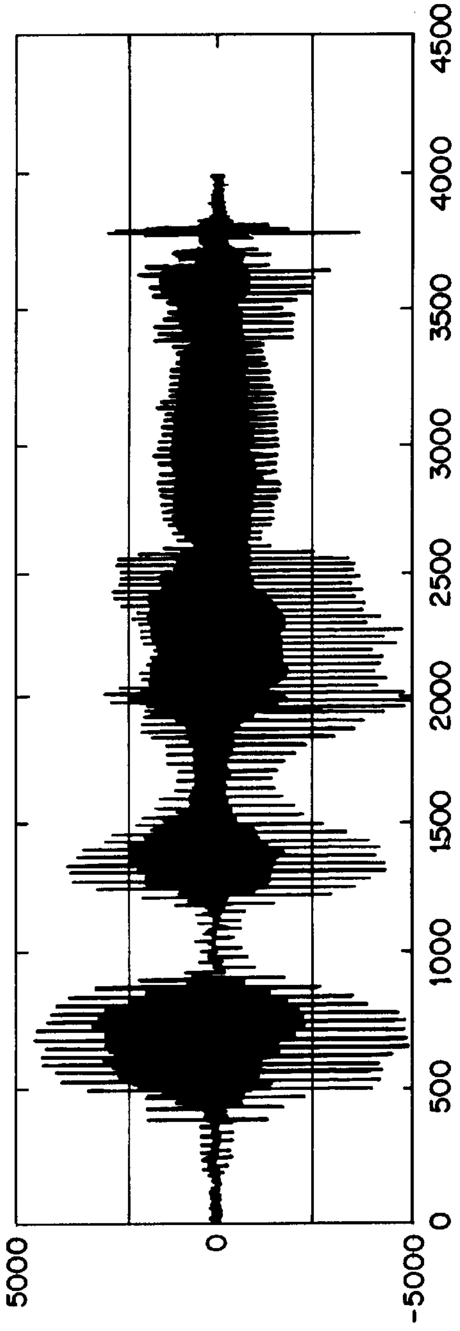
FIGS. 11*a* and 11*b* are a graphical representation of a test waveform and a clipped test waveform after processing by the apparatus of FIG. 1.
Figure 11B:
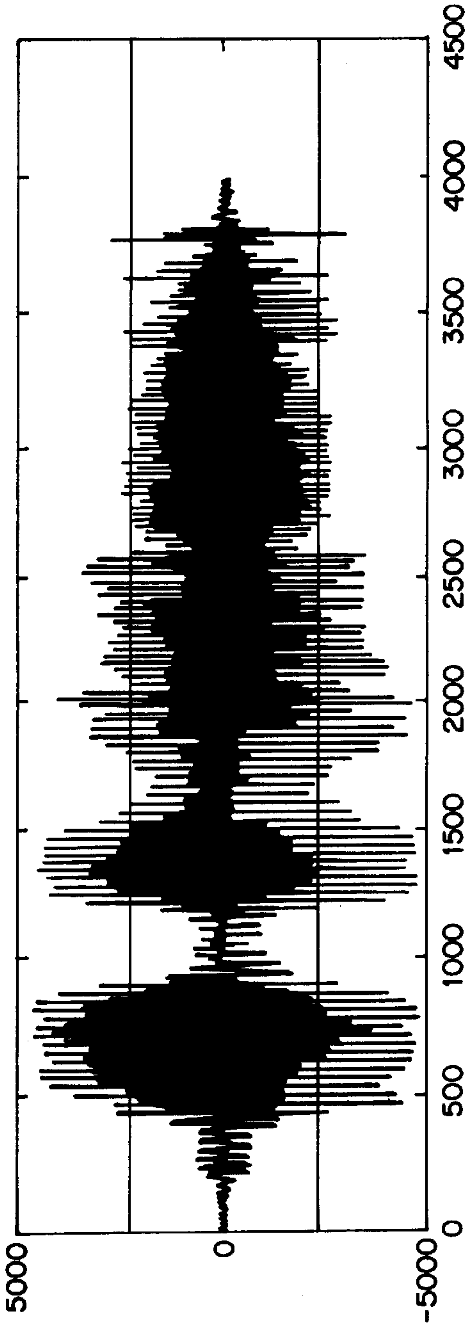
Figure 12A:
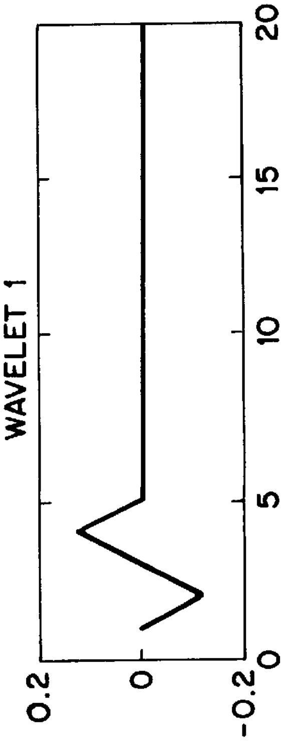
FIGS. 12*a*–14*d* show some alternative wavelets.
Figure 12B:
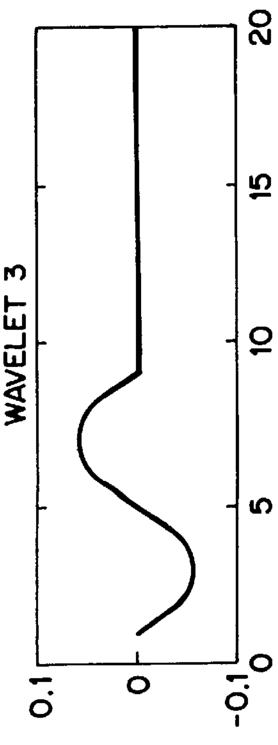
Figure 12C:
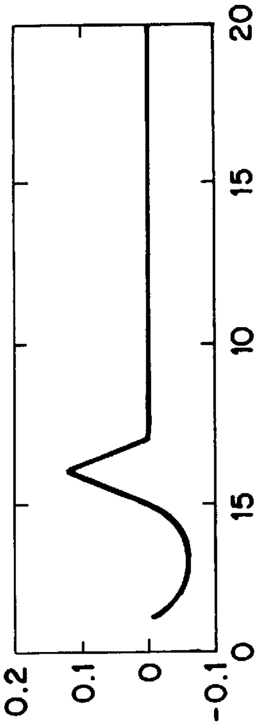
Figure 12D:
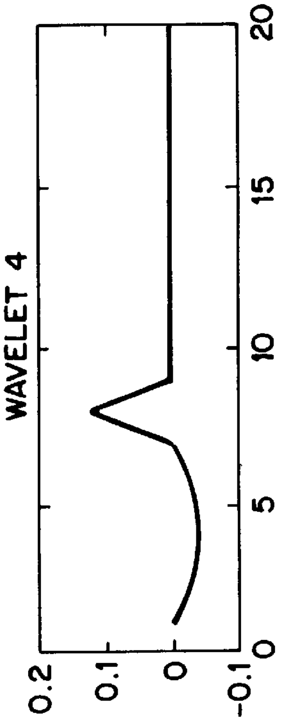
Figure 13A:
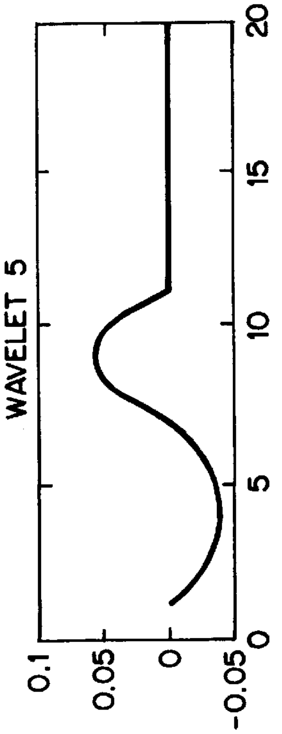
Figure 13B:
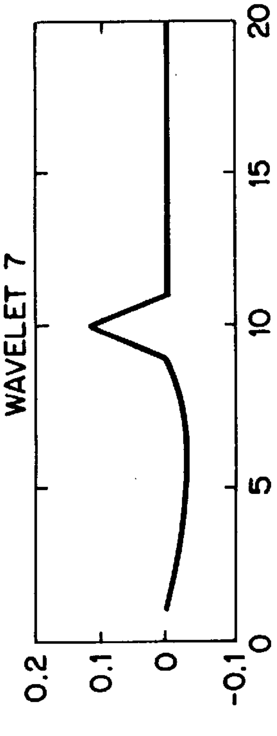
Figure 13C:
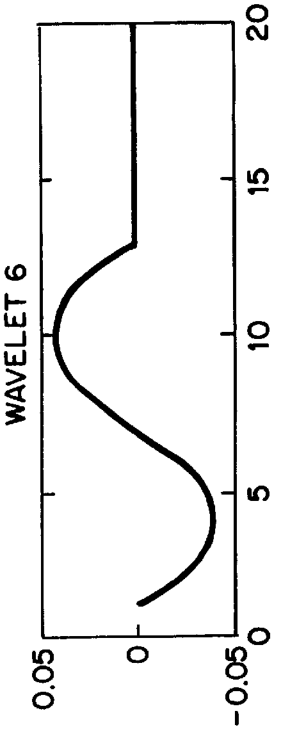
Figure 13D:
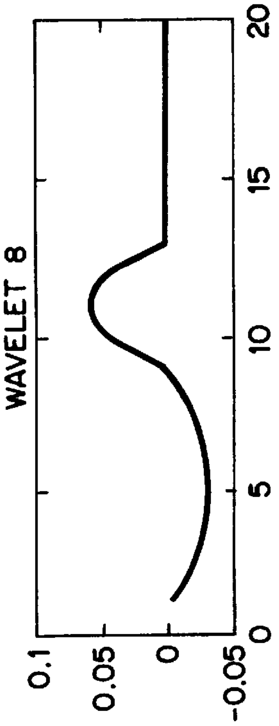
Figure 14A:
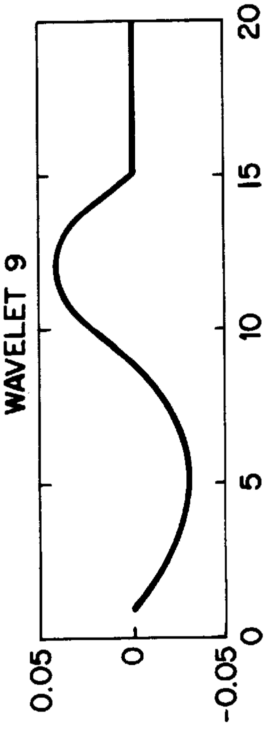
Figure 14B:
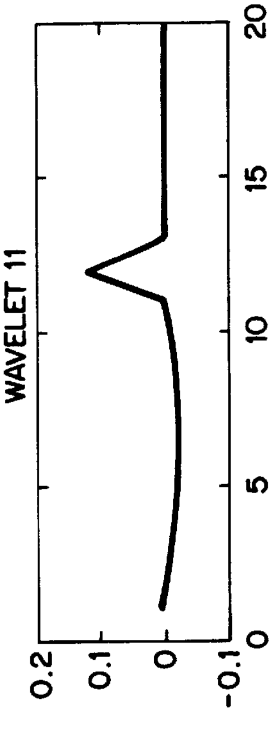
Figure 14C:
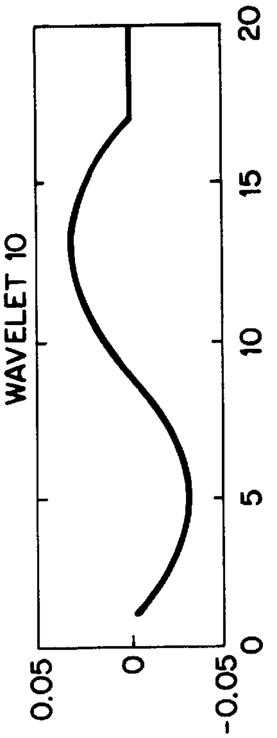
Figure 14D:
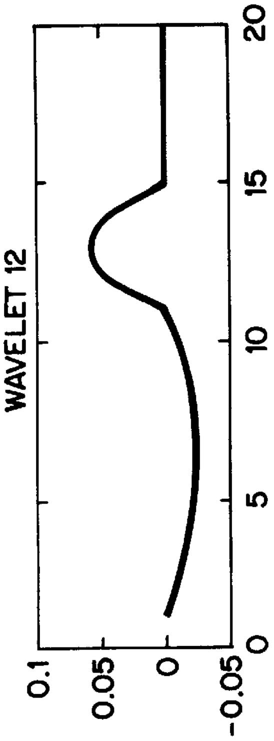

We can see the shape of the Daubachies wavelets by direct analysis of the structure in FIG. 3 to obtain the equivalent filters of FIG. 1. For the fourth order transform the first dilated wavelet is 10 samples long, the second 22, the third 46; for the sixth order these numbers are 16, 36 and 76. A direct numerical method to get these is to inverse transform impulses at and scale level. This was done to obtain FIGS. 6*a* and 6*b* showing, respectively, a 6th -rder, 4th level Daubechies wavelet and a 20th order 4th level Daubechies wavelet; where the discrete Fourier transform of the wavelets is also shown beneath. It is seen that they are band limited signals and that the lower order wavelets have significant ripple.

The effect of clipping in the wavelet transform domain is illustrated by FIGS. 7 to 9. FIGS. 7*a*–7*d* show a test waveform of 0.5 seconds of speech, plotted against sample number at 8 kHz. FIGS. 8*a*–8*e* show the $12^{th}$ order Daubechies wavelet transform of the test waveform, to five levels, plotted against sample number after decimation, whilst FIGS. 9*a*–*e* show the same transform of the test waveform clipped at ±1000 (referred to the arbitrary vertical scales on FIGS. 7*a*–7*d*). FIGS. 8*f* and 9*f* show the residual signal in each case.

Figure 10:
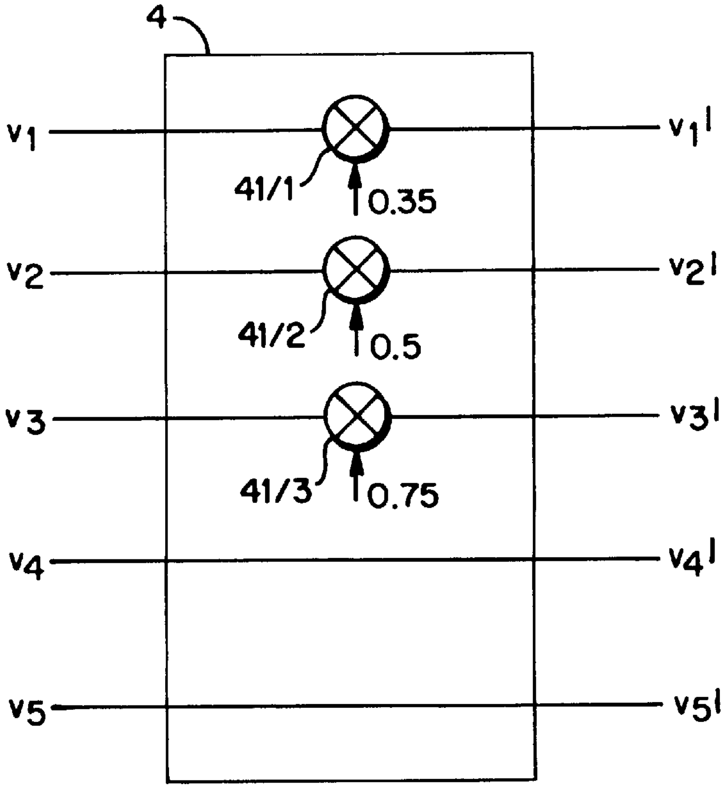
FIG. 10 shows one implementation of the processing unit in FIG. 1.

The task of the sequence processor 4 is to process the sequences of FIGS. 9*a*–*e* such that they more closely resemble those of FIGS. 8*a*–*e*. The simplest form of this processing is a linear scaling of the sequences, and the version shown in FIG. 10 shows multipliers 41/1 etc. applying the following factors:

| | |
|---|---|
| first level | 0.2 |
| second level | 0.2 |
| third level | 0.68 |
| fourth level | 1 |
| fifth level | 1 |

This arrangement acts to rebuild the dynamic range of the signal by enhancing the longer scale components of the Wavelet transform, since it was observed that these are apparently only scaled by clipping. The final scale factor s2 should be chosen by some AGC method.

FIGS. 8*a*–8*e* show a sample a of speech and b of the same speech after clipping and processing by the apparatus of FIG. 1, with the weights given above, S1=1 and S2=2.5. Clip levels are marked CL.

The determination of the best weights more formally can be done if a cost function can be defined. Some experiments involving manual search were performed using dynamic range matrixes of peaks characterised by the median of the top five absolute values in a sample, and troughs characterised by the number of samples of value less than 5.

For practical implementation the best weights should be determined from direct numerical optimisation.

Other forms of processing are possible, for example a nonlinear scaling, of possibly forming linear or nonlinear combinations of sequences. Nonlinear operations may include thresholding, windowing, limiting and rank order filtering.

If desired, this weighting may be adaptively controlled. Two aspects are addressed here.

Firstly the clipping levels may change. We might assume that s1 in some way tracks this, that is to say s1=1 when no clipping is present and decreases otherwise. Then if we were using fixed weights, $W^0$, determined by some one-time optimisation we might use $$W=s_1+(1-s_1)W^0$$

in the filter or something more complicated.

Secondly the off-line weight determination may not be adequate for the range of speech signal actually occurring on the line. In that case it could be advantageous to adaptively alter the weights in real time. At present there is no analytic cost of the weight available. A numerical function could be the product of the dynamic range measures discussed above. Since there are only a few weights in the wavelet domain filter it is feasible to do a direct gradient search. Exploring all possibilities of adding or subtracting a given step to each weight involves the evaluation of the cost function $2^n+1$ times for n weights (the number of vertices of an n-dimensional hypercube plus one for the centre point). This can be implemented by providing this number of filters with the appropriate shifted weight vectors and replacing the centre value with best performing one at set time steps.

The Wavelet Domain Filter based on the Daubechies sequence works very well. The Daubechies wavelets is generic and one might expect that better results could be obtained with wavelets that are closely matched to the speech signals themselves. In doing this it would be expected that use can be made of the fact that voiced speech is more likely to suffer from clipping. That is to say the wavelet series can, in principle, be tailored to represent in a compact and thus easily processed form, the parts of speech sensitive to clipping.

The main problem here is the design of the wavelet transform, the mother wavelet and the set of scaling and translation to be employed and how they are implemented.

In designing matched wavelets it will be very difficult to retain the orthogonality and perfect reconstruction properties that the Daubechies transform has. We will need to understand the trade-off between these properties and the improved representational powers of the sophisticated wavelets. It may be that appropriate orthogonality and slightly imperfect reconstruction would be sufficient if there were clear gains in the representational power.

There has been some work on fitting mother wavelet shapes in a least squares sense in order to achieve improved data compression. One seeks to parameterise the shape of the wavelets in some way and perform direct optimisation. Here the zero crossing patterns are used to find wavelets for the filter bank structure; only the first level is considered. Examining the zero-crossing statistics of the test waveform shows that there are repeated patterns of two or more components. The general form of most of these is a "down-chirp"; large followed by smaller intervals. As a simple ad-hoc way of building wavelets with given zero crossing intervals, parabolas were joined together. Some wavelets designed this way are shown in FIGS. 12*a*–12*d,* 13*a*–13*d* and 14*a*–14*d.*

What is claimed is:

1. An apparatus for processing speech comprising:

means to apply to a speech signal a wavelet transform to generate a plurality of transformed components each of which is the convolution of the signal and a respective one of a set of wavelets $g(t/a_i)$ where $a_i$ is a temporal scaling factor for that component and g(t) is a temporally finite waveform having a mean value of zero;

means to modify the components; and means to apply to the modified components the inverse of the said wavelet transform, to produce an output signal;

wherein the modifying means is operable to scale at least some of the components differently from one another such as to increase the dynamic range of the output signal, wherein said wavelet transformed components are a function of a significant common range of frequencies in an input speech signal.

2. An apparatus according to claim 1 in which the transform is a Daubechies wavelet transform.

3. An apparatus according to claim 2 including decimators for reducing the sampling rate of the components prior to modification.

4. An apparatus according to claim 3 in which the transform means is formed by cascaded quadrature mirror filter pairs.

5. An apparatus according to claim 1 in which the modifying means is operable to apply linear weighting factors to at least some of the components.

6. An apparatus according to claim 5 in which the weighting factors are relatively lower for relatively lower order components.

7. An apparatus according to claim 5 including means for measuring the degree of clipping of the speech signal and to vary the weighting factors as a function thereof.

8. A method for processing speech, said method comprising:

transforming a speech signal with a wavelet transform to generate a plurality of transformed components each of which is the convolution of the signal and a respective one of a set of wavelets $g(t/a_i)$ where $a_i$ is a temporal scaling factor for that component and g(t) is a temporally finite waveform having a mean value of zero;

modifying the components by scaling at least some of the components differently from one another such as to increase the dynamic range of an output signal; and inverting the modified components with the inverse of the said wavelet transform, to produce said output signal, wherein said wavelet transformed components are a function of a significant common range of frequencies in an input speech signal.

9. A method as in claim 8 in which the transform is a Daubechies wavelet transform.

10. A method as in claim 9 reducing the sampling rate of the components prior to modification.

11. A method as in claim 10 in which the transform is formed by cascaded quadrature mirror filter pairs.

12. A method as in claim 8 in which the modifying step applies linear weighting factors to at least some of the components.

13. A method as in claim 12 in which the weighting factors are relatively lower for relatively lower order components.

14. A method as in claim 12 including measuring the degree of clipping of the speech signal and varying the weighting factors as a function thereof.

* * * * *